United States Patent [19]

Kawai et al.

[11] Patent Number: 5,233,442
[45] Date of Patent: Aug. 3, 1993

[54] PHOTOSENSOR AND IMAGE READING DEVICE WITH IMPROVED CORRECTION MEANS FOR SIGNAL CORRECTION AND IMAGE READING METHOD

[75] Inventors: Tatsundo Kawai; Toshihiro Saika, both of Hiratsuka; Noriyuki Kaifu, Yokohama; Isao Kobayashi, Atsugi; Tadao Endo, Atsugi; Kouji Tomoda, Atsugi, all of Japan

[73] Assignee: Canon Kabushiki Kaisha, Tokyo, Japan

[21] Appl. No.: 932,381

[22] Filed: Aug. 19, 1992

Related U.S. Application Data

[63] Continuation of Ser. No. 534,262, Jun. 7, 1990.

[30] Foreign Application Priority Data

Jun. 7, 1989 [JP] Japan .................................. 1-143072
Jun. 7, 1989 [JP] Japan .................................. 1-143074
Jun. 7, 1989 [JP] Japan .................................. 1-143075

[51] Int. Cl.⁵ ............................................. H04N 1/24
[52] U.S. Cl. ..................................... 358/482; 358/406
[58] Field of Search ........ 358/474, 461, 464, 482–483; 250/208.1–208.2

[56]  References Cited

U.S. PATENT DOCUMENTS

| | | | |
|---|---|---|---|
| 4,479,149 | 10/1984 | Yoshioka et al. | 358/294 |
| 4,680,644 | 7/1987 | Shirato et al. | 358/294 |
| 4,691,244 | 9/1987 | Cannella et al. | 358/294 |
| 4,745,488 | 5/1988 | Kaifu et al. | 358/294 |
| 4,910,412 | 3/1990 | Ondris | 250/208.1 |

Primary Examiner—Stephen Brinich
Attorney, Agent, or Firm—Fitzpatrick, Cella, Harper & Scinto

[57] ABSTRACT

A photosensor with improved correction of image signals has a first photosensor portion including a plurality of photoelectric converting devices for reading an object and providing image signals thereof. A second photosensor portion includes a plurality of photoelectric converting devices and provides reference signals from light reflected from a reference number, or light received directly from a light source. Correction circuitry corrects the image signals from the first photosensor portion in accordance with the reference signals output from the second photosensor portion. Preferably, the photoelectric converting devices of the first and second photosensor portions are arranged in adjacent, parallel lines on the same substrate. Preferably, reference signals from the converting devices of the second photosensor are used by the correction circuitry to correct the electrical signals from substantially adjacent converting devices of the first photosensor portion. A single converting device of the second photosensor portion may be used to correct either one or more of the converting devices of the first photosensor portion.

7 Claims, 14 Drawing Sheets

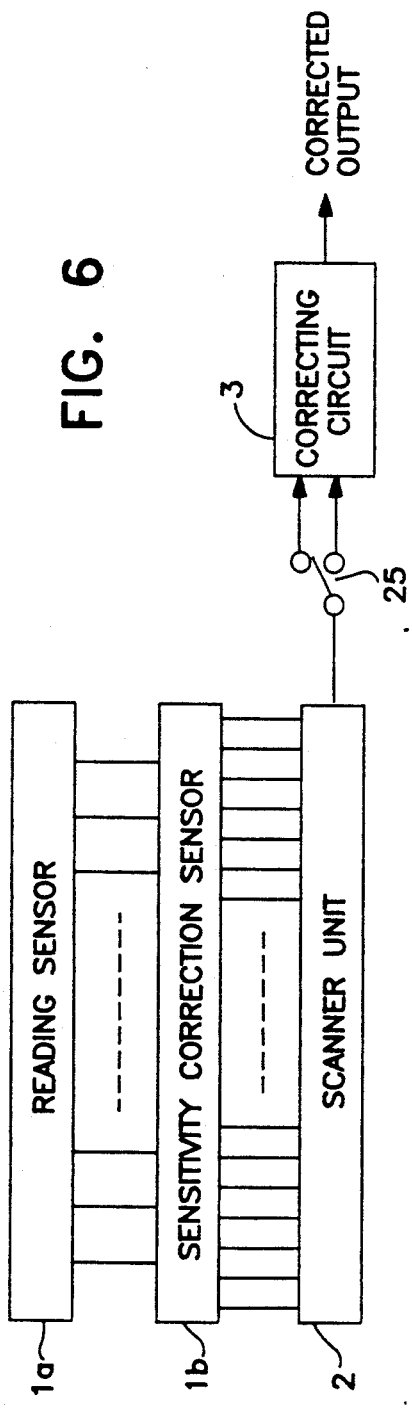
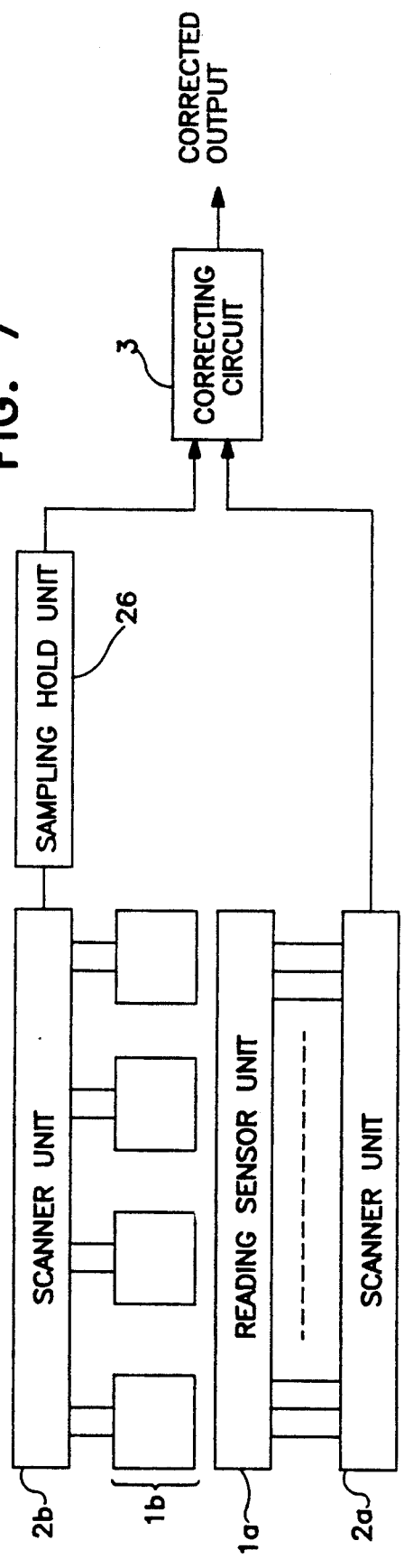

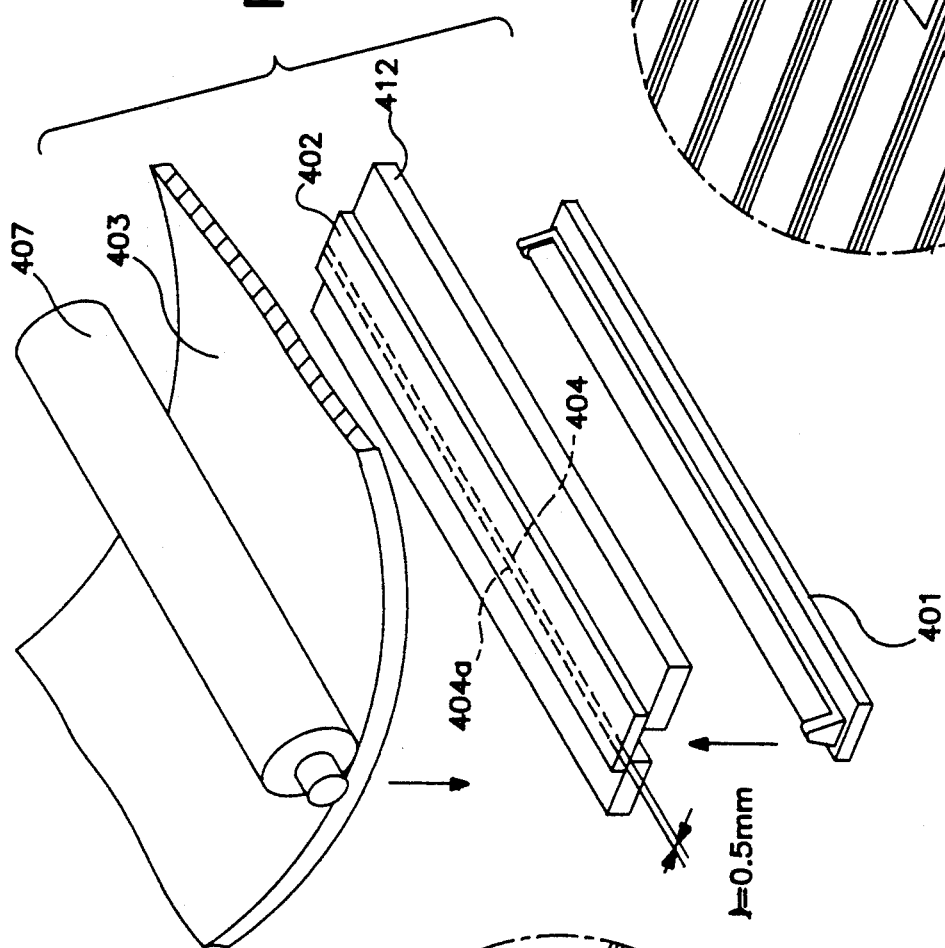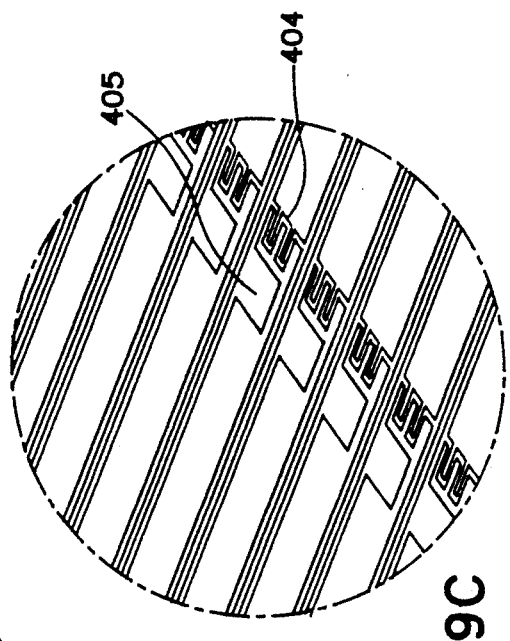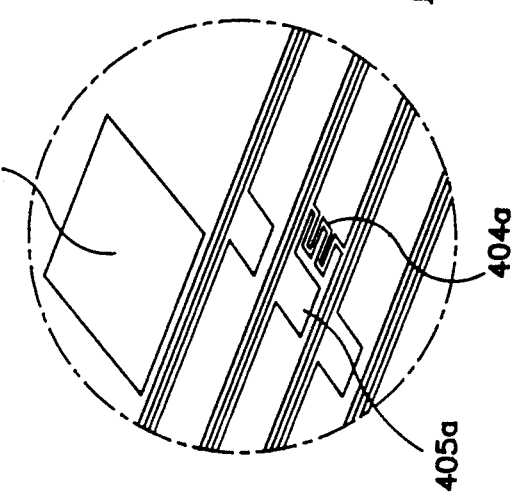

PHOTOSENSOR AND IMAGE READING DEVICE WITH IMPROVED CORRECTION MEANS FOR SIGNAL CORRECTION AND IMAGE READING METHOD

This application is a continuation of application Ser. No. 07/534,262 filed Jun. 7, 1990.

BACKGROUND OF THE INVENTION

1. Field of the Invention

This invention relates to a photosensor to be read with the image reading portion of, for example, a facsimile machine, an image reader, a digital type copying machine, etc., and particularly to an image reading device having an image reading portion employing a contact type line sensor, and to an image reading method.

Particularly, the present invention pertains to a photosensor and an image reading device having a correction means for correcting read-out signals on the basis of the standard output, and to an image reading method.

2. Related Background Art

In an image reading device which reads the image information of an original manuscript by irradiating a light on the original manuscript and converting the reflected light to an electrical signal, it is required that an electrical signal always corresponding and correctly to the original manuscript should be outputted.

However, in the image reading device of the prior art, due to nonuniformity in the light emission amount of the light source comprising a light emitting device array such as a fluorescent lamp, a LED, etc., and nonuniformity in sensitivity and temperature characteristics of the photosensor having photoelectric converting devices, it has been difficult in many cases to output electrical signals correctly corresponding to the original manuscript without photosensor change over a long period of time.

As a photosensor for photoelectrically converting the reflected light from the original manuscript in such a image reading device, an array of photoelectric converting devices has been employed. Here, it is important that the image information of the original manuscript should be converted correctly to the output electrical to signal particularly in the case of performing "gradation reading" which outputs three kinds or more of signals corresponding to the shade of the image instead of the "two-value reading" which outputs two kinds of signals of high and low levels, it is necessary to effect output conversion with sufficient precision.

There has already been commercialized, for example, an image reading device which are the contact type image sensor capable of simplifying the constitution due to no need for a reduction lens system because the original manuscript and the sensor portion corresponds one to one. However, in the device of the prior art, the photoelectric characteristics of the photoelectric converting layer such as A-Si:H film fluctuate markedly fluctuated depending on the environmental temperature, and since the temperature coefficient can be only made uniform within the array with difficulty, there have been some efforts to output the image information in multiple values. To explain by referring to a readily understandable example, in a case such as continuously reading photographs having substantially the same density, even if the first photograph may be read correctly, the temperature within the device will be elevated during continuous reading, whereby the sensitivity distribution within the array is changed. Therefore, there may sometimes occur the phenomenon that some photographs at the end may be read whiter or darker than the actual original manuscript at specific positions.

Also, and in the image reading device of the prior art, there is variance in sensitivity among the photosensitive converting devices of the photoelectric converting device array. This is because the etching depth, film thickness, etc. are varied in the production process for constitution of the above photoelectric converting device array, and it is currently almost impossible to eliminate the variance without reducing an yield. Therefore, it has been difficult for the photoelectric converting device array to convert the image information from the original manuscript to the electrical signal corresponding correctly thereto during output of the electrical signal by scanning for each photoelectric converting device.

Particularly, this point is markedly seen in the case of a sensor which has been lengthened as a contact type image sensor.

For solving such technical tasks, the image reading device with such a constitution as described below has been employed. That is, first, an original manuscript of a patternless white, namely a so called whole whiteness is read, the signals for correction reflecting nonuniformity of sensitivity of the individual photoelectric converting devices are detected and are stored in memory. Next, when reading of the actual manuscript is performed by the above photoelectric converting devices, the signals are corrected using the correction signals, and electrical signals corresponding correctly to the image information of the original manuscript are consequently outputted. An example of such a image reading device is shown in FIG. 1. Here, the outputs of the electrical signals for the white standard are initially received by the reading sensor portion 131 comprising of the photoelectric converting device array passed through the scanning portion 132 into the memory, the switch is changed over. Then on initiation of reading of the original manuscript, the switch 134 is changed over to original to input the signal into the correction circuit 135 to effect correction (calculation such as dividing calculation is done) with the output signals from the memory 133. The outputted signals thus corrected are not affected by the sensitivity variance between the respective photoelectric converting devices correspond correctly to the image information.

However, in the image reading device of such system a, because the memory for storing the signals for correction therein is required, and also because there may sometimes be difference in uniformity of sensitivity of the photoelectric converting devices caused by changes over temperature, time, etc., it becomes necessary to input the signals for correction immediately before reading for each original manuscript. For this reason, for obtaining the signals for correction, it is required to read the whole white original manuscript every time, or to provide always the whole white portion (generally at the initial head of reading) in the original manuscript, whereby control of the reading device becomes complicated, and also a restriction can occur in the form of the read manuscript.

Accordingly, for providing a device which may effect correction of signals and can be successful commercially, there remains much room for improvement in aspects of performance and cost.

Particularly, these are extremely imminent problems in fascimile machine and etc. for which high speed performance is required.

SUMMARY OF THE INVENTION

The present invention has been accomplished as the result of investigations of a large number of experiments by the present inventors to find that the variance of sensitivity of the respective photoelectric converting devices in the production process of the photoelectric converting device array changes at very low frequency in space frequency.

An object of the present invention is to provide a photosensor and an image reading device capable of signal correction and also capable of high speed actuation.

Also, it is another object of the present invention to provide an image reading device which can effect variance correction of the reading sensor portion by arranging photoelectric converting devices for correction in parallel to the photoelectric converting devices, outputting the correction signal electrically based on the white standard and utilizing the similarity in sensitivity.

Still another object of the present invention is to provide a photosensor comprising:

a first photosensor portion having photoelectric converting devices for photoelectrically converting incident optical signals, a second photosensor portion having photoelectric converting devices for obtaining a standard output, and a correction means for correcting the signals outputted from said first photosensor portion based on the signals outputted from said second photosensor portion, said first photosensor portion having a plurality of said photoelectric converting devices arranged in a first scanning direction, said second photosensor portion having a plurality of said photoelectric converting devices arranged in said first scanning direction, and said first photosensor portion and said second photosensor portion being juxtaposed in a second scanning direction different from said first scanning direction.

Still another object of the present invention is to provide an image reading device comprising:

an illumination means for illuminating an object carrying image information to be read, a photoelectric converting means having a first photosensor portion having photoelectric converting devices for photoelectrically converting incident optical signals and a second photosensor portion having photoelectric converting devices for obtaining a standard output, said first photosensor portion having a plurality of said photoelectric converting devices arranged in a first scanning direction, said second photosensor portion having a plurality of said photoelectric converting devices arranged in said first scanning direction, and said first photosensor portion and said second photosensor portion being juxtaposed in a second scanning direction different from said first scanning direction, a correction means for correcting the signals outputted from said first photosensor portion based on the signals outputted from said second photosensor portion, and an output means for outputting image signals corrected by said correction means.

Still another object of the present invention is to provide a photosensor and an image reading device which is adapted to read an image by constituting a reading sensor portion by arranging a plurality of photoelectric converting devices for photoelectrically converting the reflected light from an original manuscript on a line, wherein a sensor portion for sensitivity correction is constituted together with the above reading sensor portion by arranging a plurality of photoelectric converting devices capable of obtaining constantly the output corresponding to the white standard in parallel to the above line, and also a means for giving the output corresponding to the white standard to the above sensor portion for sensitivity correction and a means for correcting the above reading sensor portion by use of the output of the above sensor portion for sensitivity correction are equipped.

Still another object of the present invention is to provide a photosensor and an image reading device, wherein the photoelectric converting devices for correction are constituted with variance approximate to the variance of the photoelectric converting devices for reading in the vicinity thereof, whereby the variance of sensitivity of the photoelectric converting devices for correction can be detected as such as the substitute for that for reading to realize the sensitivity correction of the inherent reading sensor portion, and corrected electrical output signals can be obtained also without influences from temperature or changes with lapse of time.

Still another object of the present invention is to provide an image reading method, which comprises irradiating light on object having an image information to be read carried thereon, and correcting the image signal obtained by photoelectrically converting the reflected light from the object using a photoelectric converting device based on the signal for correction equivalent to said signal, wherein the above signal for correction is obtained by directly photoelectrically converting the light emitted from the light source which irradiates the above object.

Still another object of the present invention is to provide a photosensor and an image reading device, comprising a photoelectric converting device which irradiates light on an object to be read and reads the reflected light from the object to be read as the image signal by photoelectric conversion, and a photoelectric converting device for correction for obtaining the signal for correction equivalent to the signal obtained by photoelectric conversion of the reflected light from the white object to be read by the photoelectric converting device arranged on the same light-transmissive substrate, wherein the photoelectric converting layer of the above photoelectric converting device for correction is formed through a lower layer on the above substrate, at least a part of the lower layer is opened, and the signal for correction is obtained based on the signal photoelectrically converted by the above photoelectric converting layer by permitting light to transmit through the opening.

Still another object of the present invention is to provide a photosensor and an image reading device, which comprises a sensor for obtaining an image signal by a for reading by use of a part of the emitted light from a light source for image reading, and obtaining a sensor for a signal for correction by use of at least a part of the remaining emitted light from the above light source, wherein the above sensor for correction has a means for controlling light flux so that it may be illuminated at lower luminosity than the above sensor for reading, whereby the dose incident on the above sensor for reading and the dose incident on the above sensor for correction may be substantially the same.

BRIEF DESCRIPTION OF THE DRAWINGS

FIG. 6 is the block diagram showing the image reading device according to the second example;

FIG. 7 is the block diagram showing the image reading device of the third example;

FIGS. 19A, 19B, and 19C comprise a schematic sectional view and exploded views of the image reading device according to the tenth example of the present invention;

DESCRIPTION OF THE PREFERRED EMBODIMENTS

Figure 1:
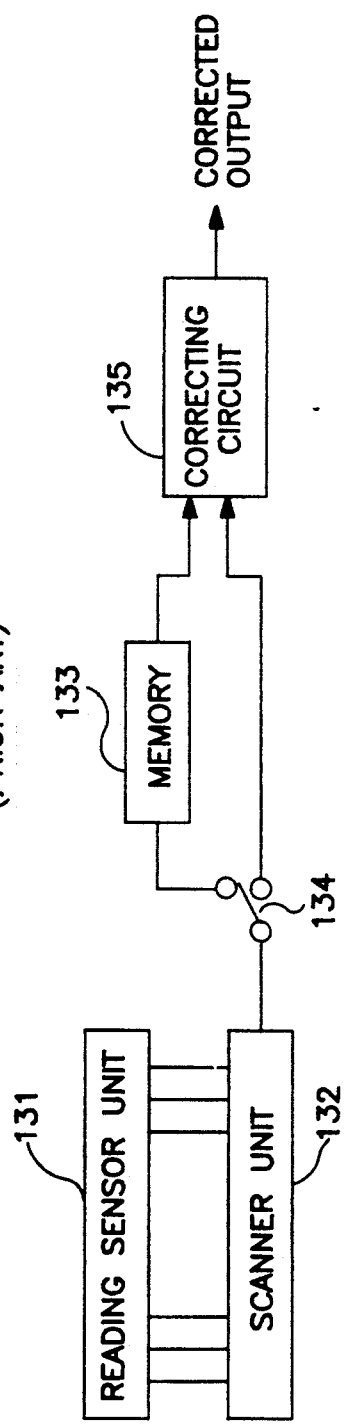
FIG. 1 is the block diagram showing a prior art example.
Figure 2:
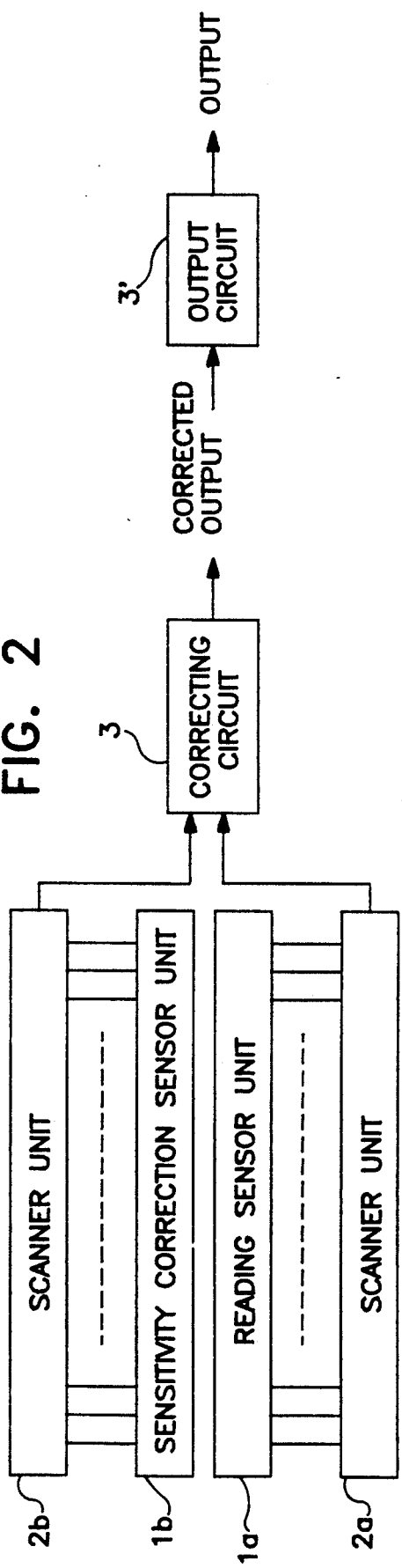
FIG. 2 is the block diagram showing the image reading device according to the first example of the present invention.

One of the preferred embodiments of the present invention is a photosensor comprising:

a first photosensor portion having photoelectric converting devices for photoelectrically converting incident optical signals, a second photosensor portion having photoelectric converting devices for obtaining a standard output, and a correction means for correcting the signals outputted from said first photosensor portion based on the signals outputted from said second photosensor portion, said first photosensor portion having a plurality of said photoelectric converting devices arranged in a first scanning direction, said second photosensor portion having a plurality of said photoelectric converting devices arranged in said first scanning direction, and said first photosensor portion and said second photosensor portion being juxtaposed in a second scanning direction different from said first scanning direction.

Also, another embodiment of the preferred embodiments is an image reading device comprising:

illumination means for illuminating an object carrying an image information to be read, a photoelectric converting means having a first photosensor portion having photoelectric converting devices for photoelectrically converting incident optical signals and a second photosensor portion having photoelectric converting devices for obtaining a standard output, said first photosensor portion having a plurality of said photoelectric converting devices arranged in a first scanning direction, said second photosensor portion having a plurality of said photoelectric converting devices arranged in said first scanning direction, and said first photosensor portion and said second photosensor portion being juxtaposed in a second scanning direction different from said first scanning direction, a correction means for correcting the signals outputted from said first photosensor portion based on the signals outputted from said second photosensor portion, and an output means for outputting image signals corrected by said correction means.

Here, the photoelectric converting device constituting the first photosensor portion and the second photosensor portion may be one which can convert optical signals to electrical signals, including the photovoltaic type and the photoconductive type. Its constitution may be in shape of the planar type or the sandwich type, including also the Schottky barrier type, the MIS type, the PN type, the PIN type, the insulation gate type transistor type, etc. As the photoelectric converting layer of the photoelectric converting device, there are amorphous silicon (a-Si), amorphous silicon carbide (a-SiC), amorphous silicon germanium (a-SiGe), amorphous silicon germanium carbide (a-SiGeC), etc. which are non-single crystal semiconductor materials, and these should be preferably compensated with hydrogen and/or halogen. Otherwise, compound semiconductors such as CdS, CdSe, SeAsTe, ZnSe, etc. may be employed.

These photoelectric converting devices are provided in predetermined numbers corresponding to the first and second photosensor portions, respectively, and scanned by the same scanning means or separate scanning means to read image information The first and second photosensor portions should preferably comprise a constitution capable of production at low cost by being formed on the same substrate by the same process.

As the correction means applicable to the present invention, there may be employed a circuit containing a comparator, etc. which outputs the signal corresponding to the difference by comparing the standard signal from the second sensor portion with the predetermined standard voltage value, etc., and calculating the image signal from the first sensor portion based on this.

The output signal thus corrected is outputted as the image signal through an output circuit provided at the photosensor or the image reading device, and this is outputted.

FIRST EXAMPLE

Figure 3A:
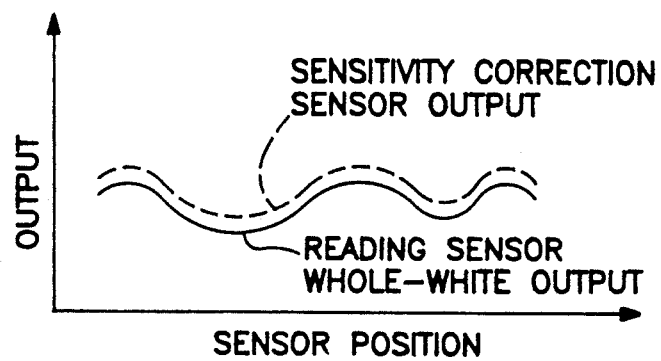
FIGS. 3A and 3B are graphs showing the variance and the corrected output of the respective outputs of the sensors corresponding to the sensor positions.
Figure 3B:
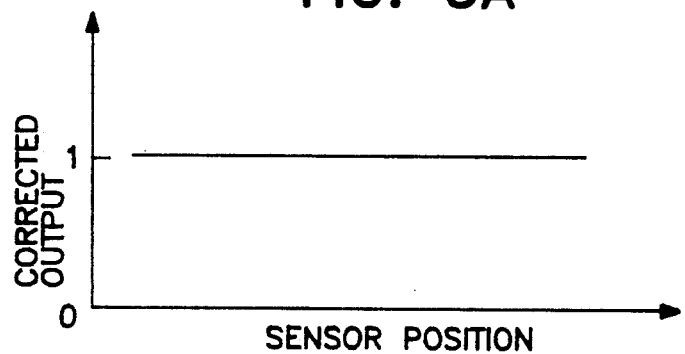

Referring now to the drawings, examples of the present invention are described in detail. First, the first example is described by referring to FIG. 2 to FIG. 5. Here, there are located a reading sensor portion 1a having a plurality of photoelectric converting devices arranged on a line in a photoelectric converting device array, and juxtaposed thereto, a sensor portion for sensitivity correction 1b having a plurality of photoelectric converting devices arranged on a line in another photoelectric device array. These are prepared in the same preparation process. Therefore, the extent of variance of sensitivity of each photoelectric converting device of the reading sensor portion which occurs depending on the variance of etching depth, film thickness, etc. is similar to the extent of variance of the sensitivity of corresponding photoelectric converting device of the sensor portion for sensitivity correction 1b in the vicinity. Accordingly, in this example, the electrical signals output successively from the respective photoelectric converting devices of the above reading portion 1a are delivered to the correction circuit 3 by the scanning portion 2a, and also the electrical signal output successively from the respective photoelectric converting devices of the above sensor for sensitivity correction 1b are delivered as the sensitivity correction signals to the correction circuit 3 by the scanning portion 2b. Since correction is thus done for each photoelectric converting device, it is hardly influenced by changes. over time, temperature, etc. Thus, electrical output signals corresponding correctly to the image information can be obtained. FIG. 3A shows the outputs corresponding to the respective sensor positions of the reading sensor portion 1a and the sensor portion for sensitivity correction 1b. It has been clarified that sensitivity variances are similar to each other between the photoelectric converting devices of the both sensor portions (1a, 1b). In short, if the output signal of the reading sensor portion 1a is corrected by the output signal from the sensor portion for sensitivity correction 1b, a constant and uniform electrical signal (in white standard) as shown in FIG. 3B is obtained. Therefore, during reading of an original manuscript, output signals corresponding correctly to image information can be obtained, whereby reproducibility of images of high quality can be ensured.

Figure 5:
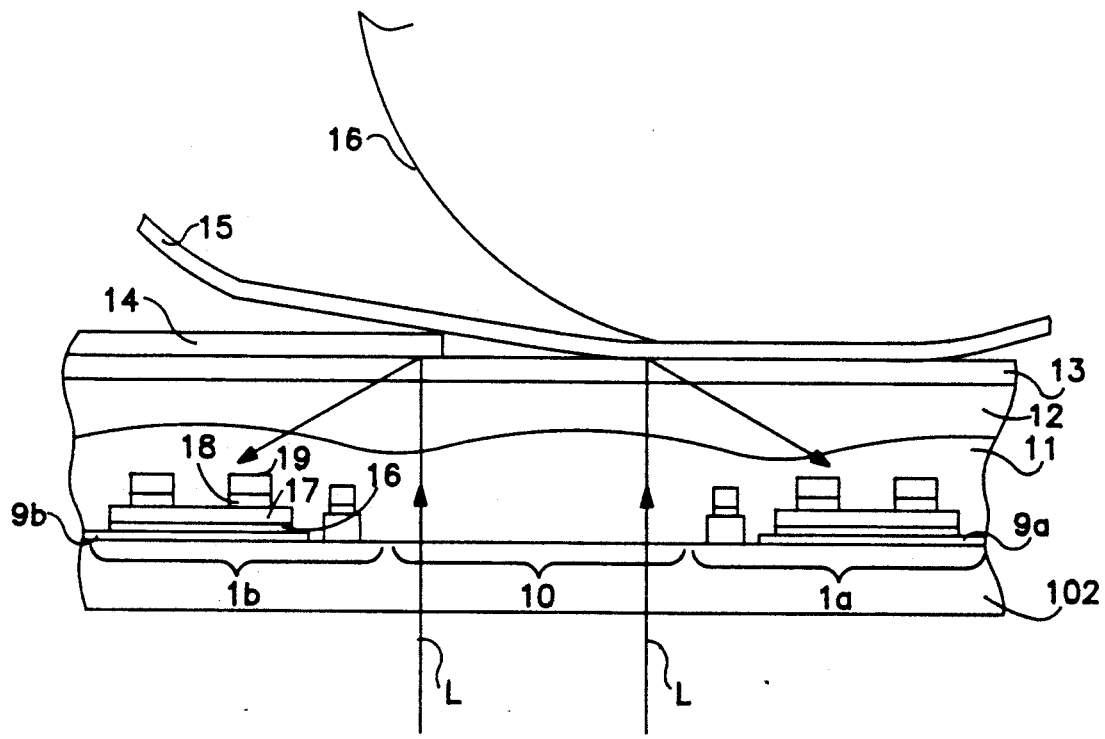
FIG. 5 is a schematic sectional view along the line A—A' in FIG. 4.
Figure 4:
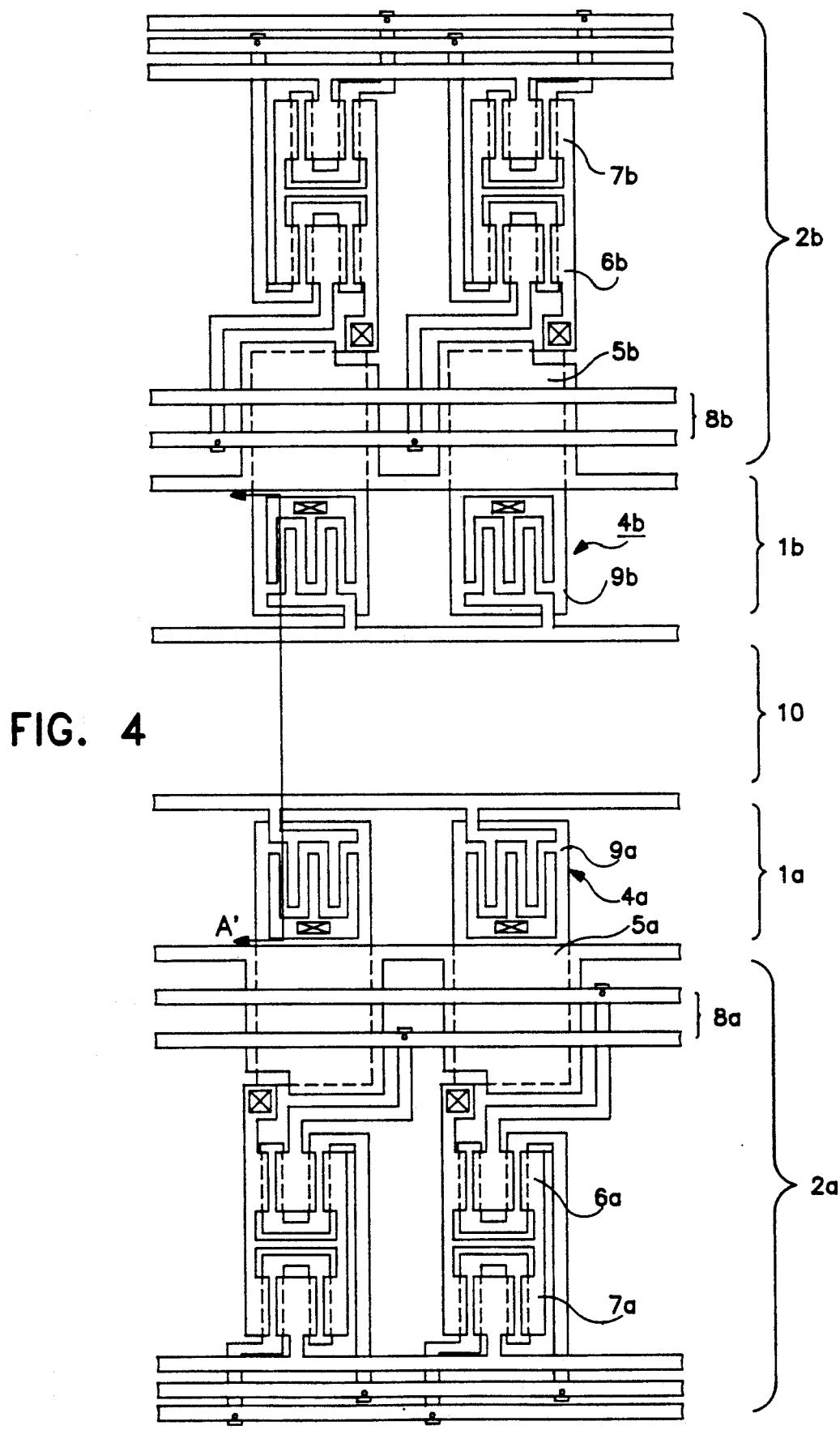
FIG. 4 is a schematic plan view showing a part of the pertinent portion of the image reading device according to the first example.

Specific constitutions of the above sensors 1a, 1b and the scanning portions 2a, 2b are shown in FIG. 4 and FIG. 5. In FIG. 4, only the respective elements printed are shown under superposed state. That is, here, the photoelectric converting portions 4a, 4b corresponding respectively to the reading sensor portions 1a, 1b, the accumulation condensor portions 5a, 5b corresponding respectively to the scanning portions 2a, 2b, the switches for transfer 6a, 6b, the switches 7a, 7b for discharging and the matrix wiring portions 8a, 8b are formed integrally on the same substrate. And, in this example, an incident window 10 for illumination of an original manuscript is provided between the both sensor portions 1a, 1b. The above-mentioned accumulation condensor portions 5a, 5b respectively accumulate the outputs of the photoelectric converting device portions 4a, 4b, and also the charge signals accumulated are supplied to the correction circuit 3 by turning ON the switches for transfer 6a, 6b, reset to the state before reading by turning ON the switches for discharging 7a, 7b, whereby it becomes again possible to accumulate charges into the accumulation condensor portions 5a, 5b. In the Figures the symbols 9a, 9b are light shielding layers for preventing incidence from the light source side. In integrating such a constitution, the photoconductive semiconductor layer 17 as the photoelectric converting layer and the insulating layer 16 as seen in FIG. 5 may be employed. As the former, particularly an a-Si:H film as the non-single crystal film may be employed, while as the latter silicon nitride film (SiNH) may be employed.

The photoconductive semiconductor layer 17 and the insulating layer 16 are used as the constituent elements for constitution by integration of the photoelectric converting device portions 4a, 4b, the accumulation condensor portions 5a, 5b, the switches for transfer 6a, 6b and the switches for discharging 7a, 7b, and otherwise also interposed between the upper layer wiring and the lower layer wiring. Further, at the interface between the upper layer electrode wiring and the substrate, the A-Si:H film 18 doped with P or As to the n+ type is formed to take an ohmic junction. In FIG. 5, the symbols 11 to 13 are protective layers, and 14 is a diffusion layer as the white standard member which is the standard surface giving standard information provided thereon.

And, the light L incident from the light source (not shown) as the illumination means through the incident window 10 is reflected at the original manuscript surface 15 and the white standard member 14 to change the electroconductivity of the photoconductive semiconductor layer 17 which is A-Si:H, thereby changing the current flowing between the opposed upper layer electrode wirings 19 formed in the shape of comb.

In this example, the above white standard member 14 may be one having a color for obtaining the standard signal, but is preferably formed of a layer of white pigment.

The accumulation condensor portions 5a, 5b are MIS type condensors constituted of the above light shielding layers 9a, 9b which also function as the lower electrode wirings, a dielectric member comprising the insulating layer 16 and the photoconductive semiconductor layer 17 formed on the lower electrode wiring, and the wiring formed simultaneously with formation of the upper electrode wiring 19 of the sensor portions 1a, 1b on the above photoconductive semiconductor layer 17.

The protective layer 11 is constituted as the passivation layer A which is intended primarily to protect and stabilize the semiconductor layer surface, the protective layer 13 is constituted of a light-transmissive insulating layer of high hardness as the abrasion resistance layer for direct contact with the original manuscript, and further the protective layer 12 positioned between the both protective layers 11, 13 is constituted as the passivation layer B which is intended to improve adhesiveness of both and humidity resistance.

In this example, the protective layer 11 is formed by a coating of polyimide resin, the protective layer 12 by a coating of epoxy type resin, and further the protective layer 13 is formed of a Seiclo sheet glass with a thickness of about 50 μm.

With such a constitution, since the reflected light from the original manuscript 15 enters constantly the reading sensor portion 1a, and the reflected light from the white standard member 14 constantly enters the sensor for sensitivity correction 1b, corresponding outputs are outputted from the respective photoelectric converting devices 4a, 4b, and by use of the outputs, sensitivity variances for the respective photoelectric converting devices 4a can be corrected as described above.

As described above, in this example, by arranging the sensor portion for correction 1b juxtaposed in the vicinity of the sensor portion for reading 1a, a signal with a small variance can be provided and also high speed actuation can be performed.

This is because, while the variance in the likewise direction which is the first scanning direction has a relatively longer period, the variance in the direction perpendicular said lengthwise direction which is the second scanning direction can fall within a negligible range even when high performance is pursued, because the distance between the reading sensor portion and the sensor portion for correction is sufficiently smaller than said longer period.

SECOND EXAMPLE

In the first example, scanning portions 2a, 2b are provided independently of the reading sensor portion 1a and the sensor portion for sensitivity correction 1b, respectively. In this example, as an example when there is no restriction with respect to the scanning speed at the scanning portion and the minimum line width in the production process, as shown in FIG. 6, the constitution is made so that correction calculation is made by using the scanning portion (shown by the symbol 2) in common and scanning alternately the output from the reading sensor portion 1a and the output from the sensor portion for sensitivity correction 1b by change-over of the switch 25.

THIRD EXAMPLE

Also, in the first example, 4 bits of the photoelectric converting device of the sensor for sensitivity correction are arranged for one bit of the photoelectric converting device of the reading sensor portion 1a. In this example, since the sensitivity variance is very low in frequency as the space frequency, one bit of photoelectric converting device of the sensor portion for sensitivity correction is arranged for M bits of the photoelectric converting devices of the reading sensor portion. FIG. 7 is a schematic block diagram of the image reading device with such a constitution.

Figure 8A:
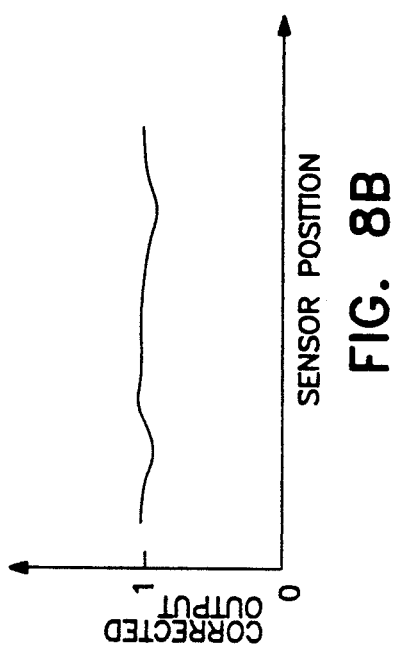
FIGS. 8A and 8B are graphs showing the variance and the corrected output of the respective outputs of the sensors corresponding to the sensor positions of the example shown in FIG. 7.
Figure 8B:
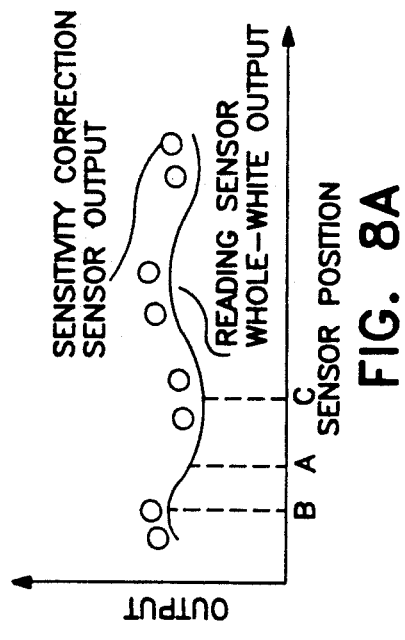

In this example, as shown in FIG. 8A, the output of the sensor portion for sensitivity correction 1b is not continuous, and therefore for the sensitivity correction at the position where there is no output corresponding to the sensor portion for sensitivity correction 1b even if there may be an output on the side of the reading sensor portion 1a (such a situation occurs because there is no one-for-one correspondence), the output before the sensor portion for sensitivity correction 1b held by the sample holding portion 26 shown in FIG. 7 is used. For example, in FIG. 8A, when sensitivity correction of the reading sensor portion of the sensor position (A) is effected, the output of the sensor for sensitivity correction of the sensor position (B) is held, and this is used for correction. The held value is used for correction of the output of the reading sensor portion 1a in the course of scanning until the next output captured by the sensor for sensitivity correction (indicated by the sensor position (C) in FIG. 8A) is obtained. This corrected output is shown by FIG. 8B, becoming substantially an equal value. The relationship of the bit number of M:1 is selected and set to a suitable value depending on the space frequency and amplitude of the sensitivity variance of the reading sensor, the gradation of reading, etc. Also, by setting of the time constant of the sample holding portion 26, it becomes possible to effect correction to a level without trouble in practical application. Thus, by reducing the bit number of the sensor portion for sensitivity correction 1b, the scale of the scanning portion can be also made smaller.

FOURTH EXAMPLE

Figure 9:
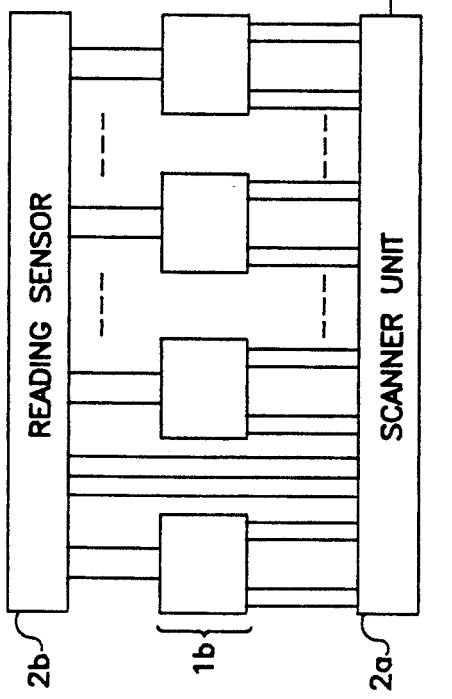
FIG. 9 is the block diagram showing the fourth example.
Figure 10:
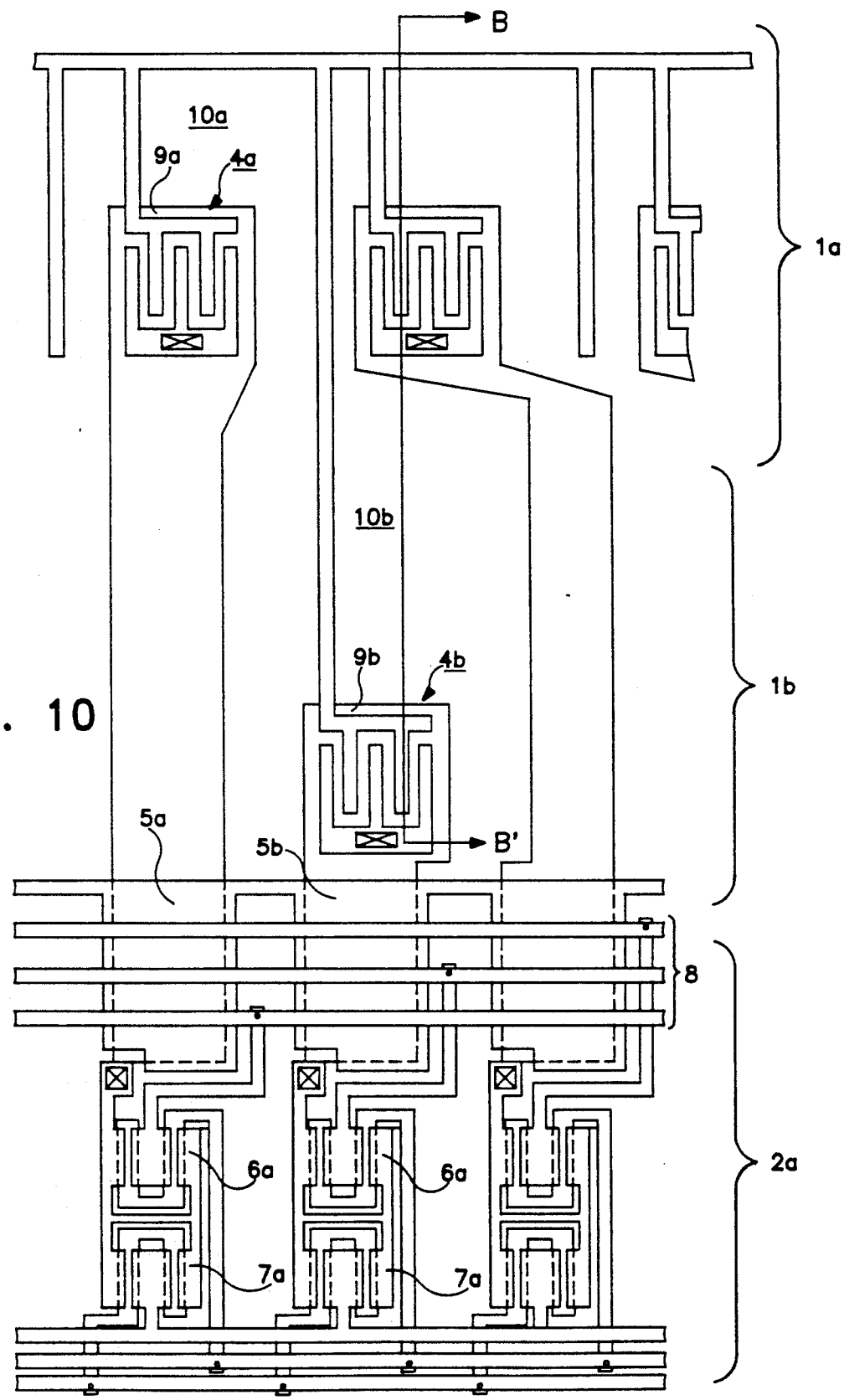
FIG. 10 is a schematic plan view of the pertinent portion of the image reading device according to the fourth example.
Figure 11:
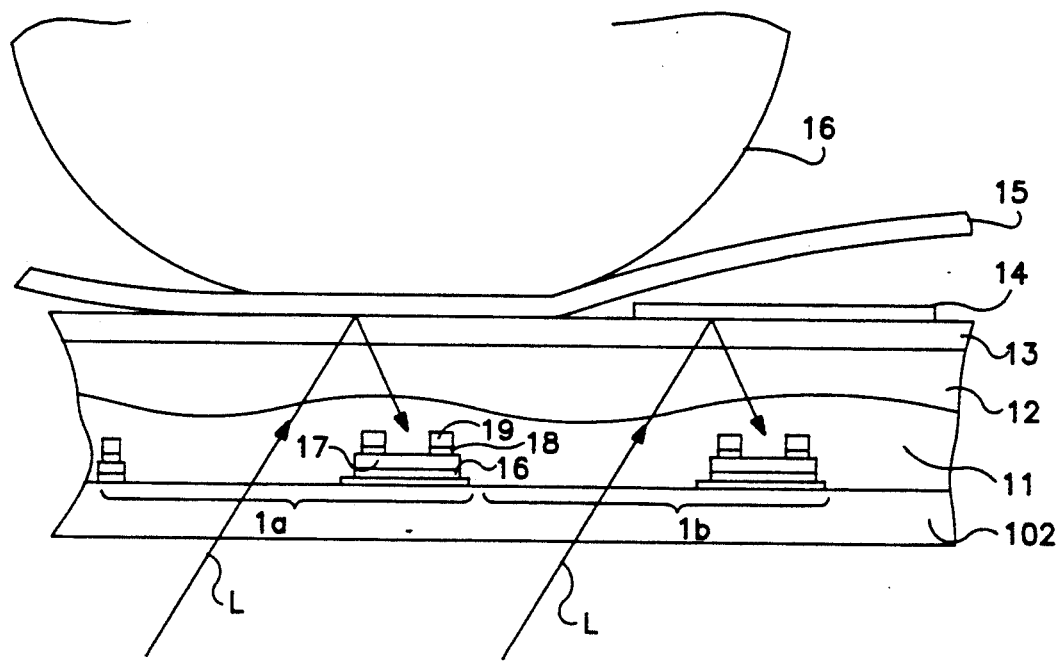
FIG. 11 is a sectional view along the line B—B' in FIG. 10.

By combining the respective examples in FIG. 6 and FIG. 7, an image reading device with a constitution as shown in FIG. 9 can be obtained. Such a constitution is shown in detail in FIG. 10 and FIG. 11. The respective constituents are the same as in the and case of the first example, the same symbols are given in the drawing. Here, the accumulation condensor portion 5b, the switch 6b for transfer which transfers the accumulated charges and the switch for discharge which resets the charges at the accumulation condensor portion 5b to the initial state as the output accumulation portion of the photoelectric converting device 4b of the sensor portion for sensitivity correction 1b are included in the arrangement of the accumulation condensor portion 5a, the switch 6a for transfer thereof and the switch for discharge for resetting 7a as the output accumulation of the photoelectric converting device 4a of the reading sensor portion 1a. With such a constitution, the reflected light from the original manuscript 15 is permitted to enter the photoelectric converting device 4a of the reading sensor portion 1a, and the reflected light from the white standard member 14 is permitted to enter constantly the photoelectric converting device 4b of the sensor portion for sensitivity correction 1b, whereby outputs corresponding to the respective lights are successively obtained. And, the output of the sensor portion for sensitivity correction 1b can be corrected in sensitivity at a level without any problem in practical application by use of the corresponding output subjected to sample and holding as the signal for correction in the course of scanning by M bits of the reading sensor portion 1a.

FIFTH EXAMPLE

This example, similarly as in examples described above, has white paint or a matter corresponding to a white original manuscript constantly in contact with the original manuscript contact surface of a part of the photoelectric converting devices, and detects the light reflected from that portion by a photoelectric converting device. This signal becomes the signal for correction reflecting the respective non-uniformities as described above. By use of the signal for correction, the practical reading signal of the original manuscript can be corrected, consequently outputting the image information corresponding correctly to the original manuscript.

Figure 12:
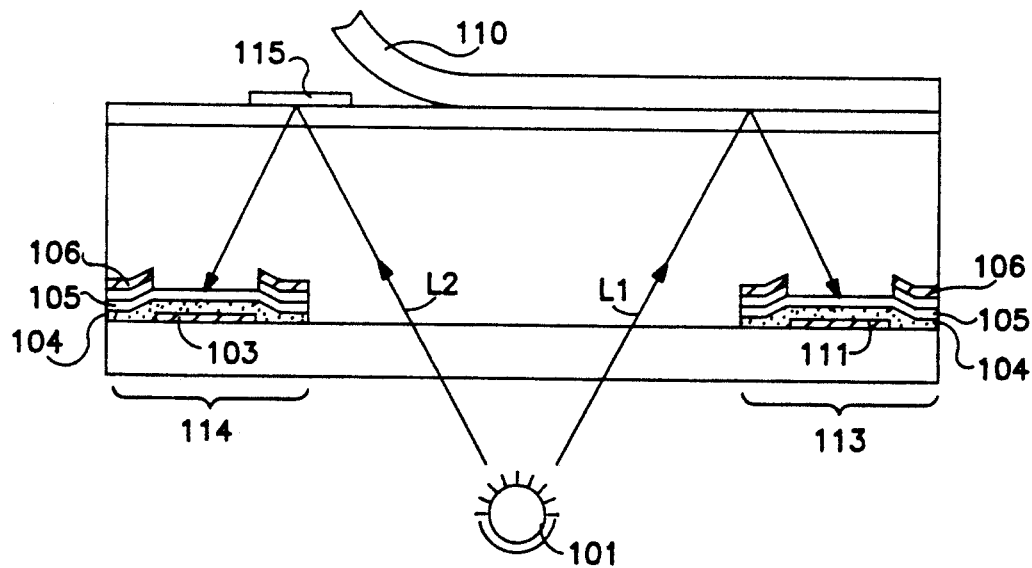
FIG. 12 is a schematic sectional view of the image reading device according to the fifth example.

FIG. 12 is a schematic sectional view for illustration of the constitution of the sensor portion for white correction with white paint in contact with the upper portions and the sensor portion for image reading.

As shown in the FIG. 12, the incident light $L_1$ emitted from the LED array 101 as the light source is reflected at the original manuscript 110 and enters the reading sensor portion 113. On the other hand, the reflected light $L_2$ is reflected at the reflecting member 115 of white paint or a matter corresponding to white original manuscript and enters the sensor portion for correction 114.

SIXTH EXAMPLE

In the fifth example as described above, since the reflecting member of white paint or a matter corresponding to white original manuscript which is the pure white portion is provided constantly by adhesion, etc. on the original manuscript contact surface above the photoelectric converting device, designs of the original manuscript for reading and the rollers for delivering the original manuscript for reading may be restricted, and the step of adhering white paint and a matter corresponding to white original manuscript is required. Hence, improvements are left to be achieved for aiming at further decreased cost.

The image reading method according to this example obtains the signal for correction by photoelectrically converting directly the light emitted from the light source for irradiation of light on the above material to be read, thereby requiring no special constitution for obtaining the signal for correction.

The image reading device for that purpose forms the photoelectric converting layer of the sensor portion for correction on a transparent substrate through a lower layer, opens at least a part of the lower layer and obtains the signal for correction based on the signal photoelectrically converted by the above photoelectric converting layer by permitting light to enter through the opening. In this example, in addition to making no special constitution for obtaining the signal for correction necessary, the area and shape of the opening can be varied by use of conventional semiconductor preparation process without increasing the number of steps, and therefore the signal for correction can be obtained easily by controlling the dose of light incident on the sensor portion for correction.

In the following, this example is described in more detail by referring to drawings.

Figure 13:
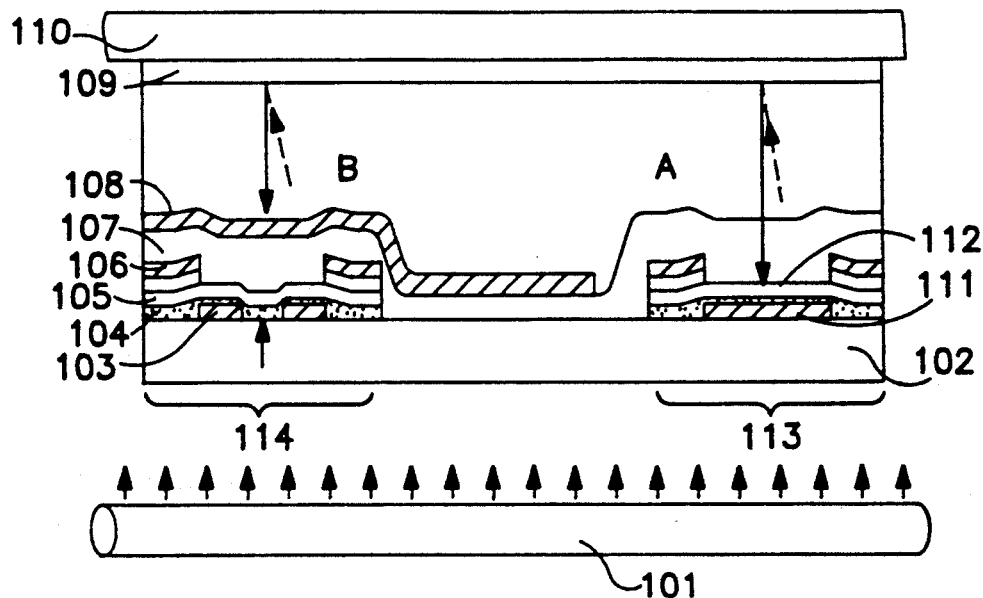
FIG. 13 is a schematic sectional view showing the constitution of the image reading device according to the sixth example of the present invention.

FIG. 13 is a schematic sectional view showing the constitution of the reading portion of the sixth example of the image reading device according to the present invention.

Figure 14:
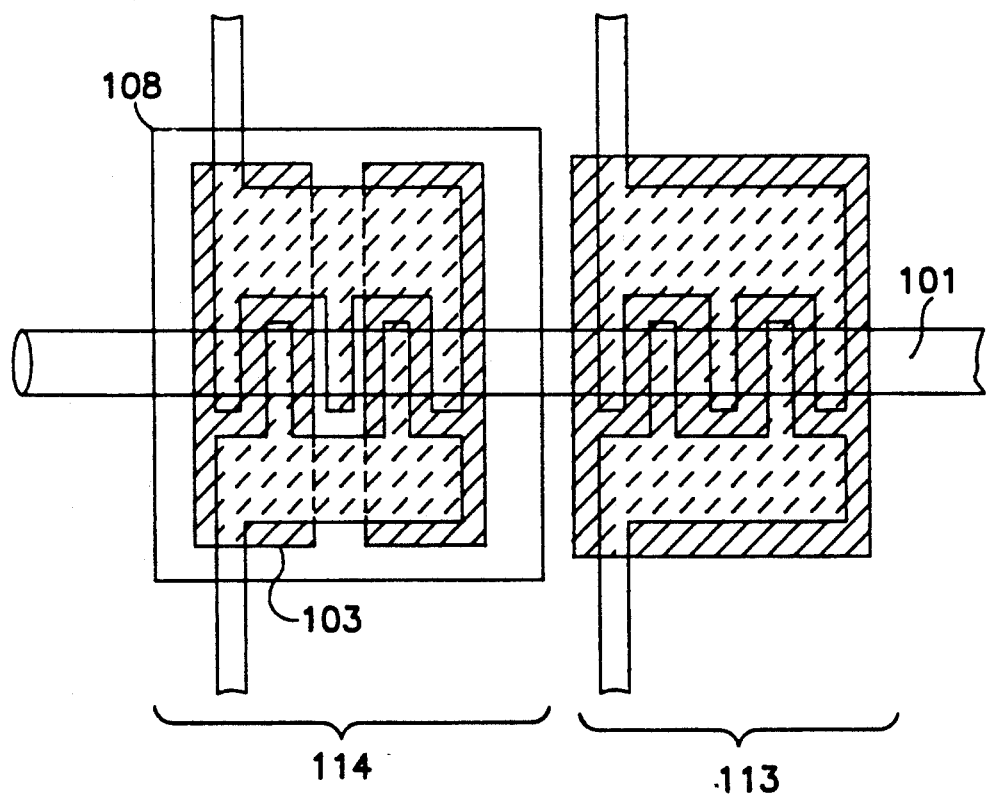
FIG. 14 is a schematic plan view of the reading portion of the image reading device shown in FIG. 13.

FIG. 14 is a plan view of the reading portion shown in FIG. 13.

In FIG. 13, on the transparent substrate 102 of glass, etc. are formed the sensor portion for image reading 113 and the sensor portion for white correction 114, with their constitutions being such that gate portions 103 and 111, the insulating layer 104 such as of silicon nitride, etc. are formed on the transparent substrate 102, and a photoconductive layer 105 comprising amorphous silicon, etc. formed as the photoelectric converting layer. A part of the gate portion 103 is provided with openings as shown in FIG. 14 so that light can be transmitted therethrough. Further, through the semiconductor layer with an impurity for ohmic contact doped at high concentration, a pair of main electrode portions 106 are formed, and the protective layer 107 and the light shielding layer 108 are formed thereon. On the protective layer 107 and the light shielding layer 108 is provided the protective layer 109 which contacts the original manuscript 110 through a transparent protective layer.

The light from the LED array 101 as the light source irradiates the original manuscript 110 in a line, the reflected light from the original manuscript 110 is permitted to enter the light-receiving surface 112 of the sensor portion for reading from the upper side to irradiate the photoconductive layer 105, whereby current passes between the main electrode portions 106, thereby creating an image signal. On the other hand, no reflected light from the original manuscript 110 enters the sensor portion for correction 114 due to the presence of the light shielding layer 108. Instead, since the gate portion 103 is opened, the direct light from the LED array passing through the glass substrate 102 enters, passes through the insulating layer 104 and reaches the photoconductive layer 105, whereby current passes between the main electrodes 106 to create the signal for white correction.

SEVENTH EXAMPLE

Figure 15:
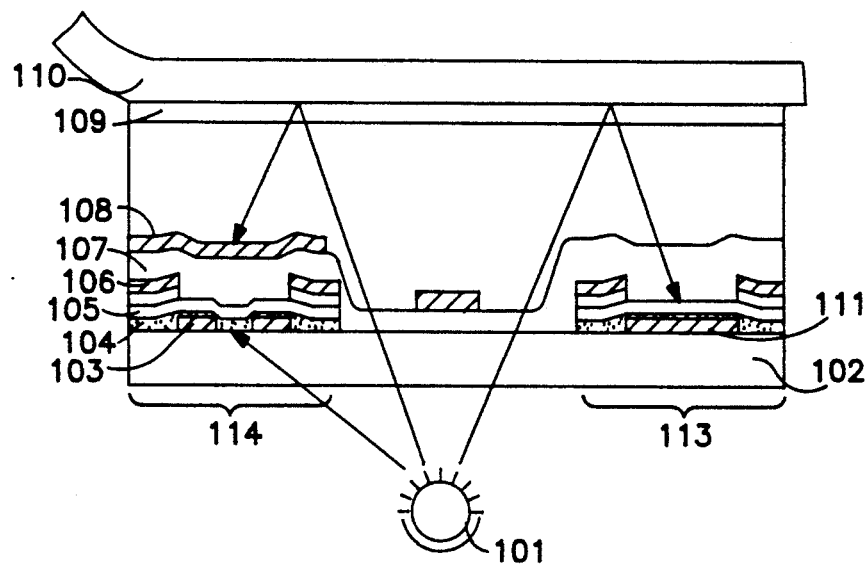
FIG. 15 is a schematic sectional view showing the constitution of the image reading device according to the seventh example of the present invention.

FIG. 15 is a schematic sectional view showing the constitution of the reading portion of the seventh example of the image reading device according to the present invention.

Figure 16:
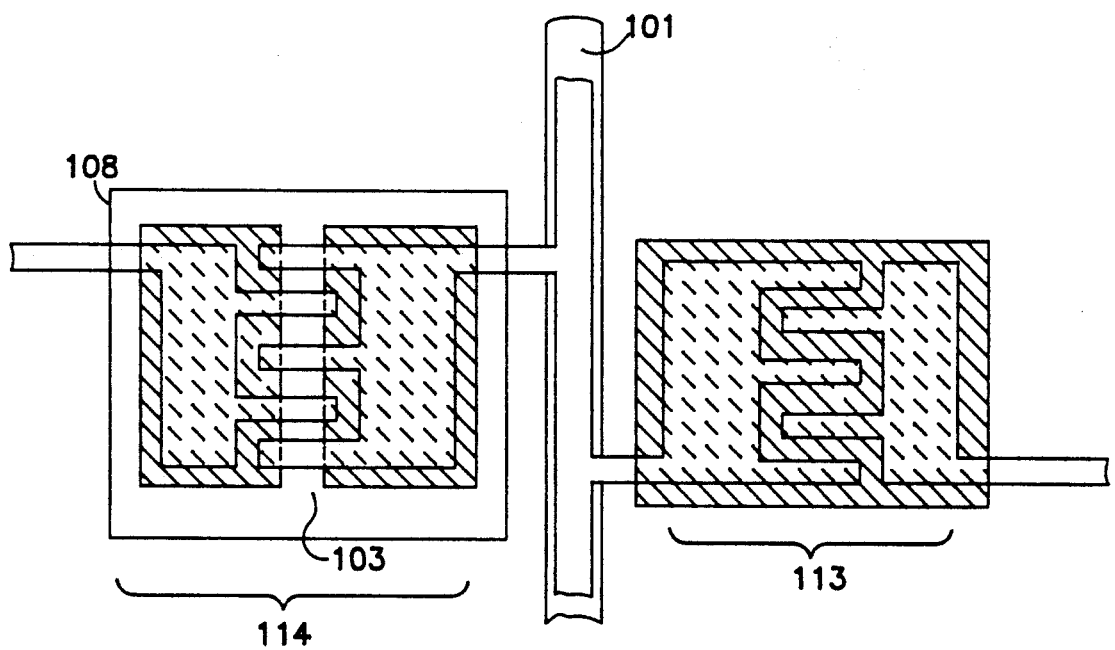
FIG. 16 is a schematic plan view of the reading portion of the image reading device shown in FIG. 15.

FIG. 16 is a plan view corresponding to the reading portion shown in FIG. 15.

The same constituent members as those shown in FIG. 13 and FIG. 14 are attached with the same symbols, and their descriptions are omitted.

As shown in FIG. 16, in this example, the sensor portion for image reading 113 and the sensor portion for white correction 114 are not arranged juxtaposed on the same line as in the first example, but in parallel to each other. The LED array 101 is arranged at the center position of them. By such a constitution, the sensor portions can be arranged not only at the ends of the image reading sensor array, but in the same bit number as the image reading sensor array, whereby the signal for white correction reflecting non-uniformity of sensitivity and temperature characteristics within the sensor array can be obtained.

As described in detail above, the image reading method and the image reading device according to the sixth and seventh examples can correct non-uniformity of the original manuscript reading signal appearing at the respective reading sensor portions with a simple constitution of the sensor portion for correction.

Also, by removing the lower layer of the photoelectric converting layer of the sensor portion for correction, the area and the shape of the photoelectric converting portion can be varied, whereby it is possible to control the output of the signal for correction without making the correction circuit complicated.

EIGHTH EXAMPLE

Figure 17:
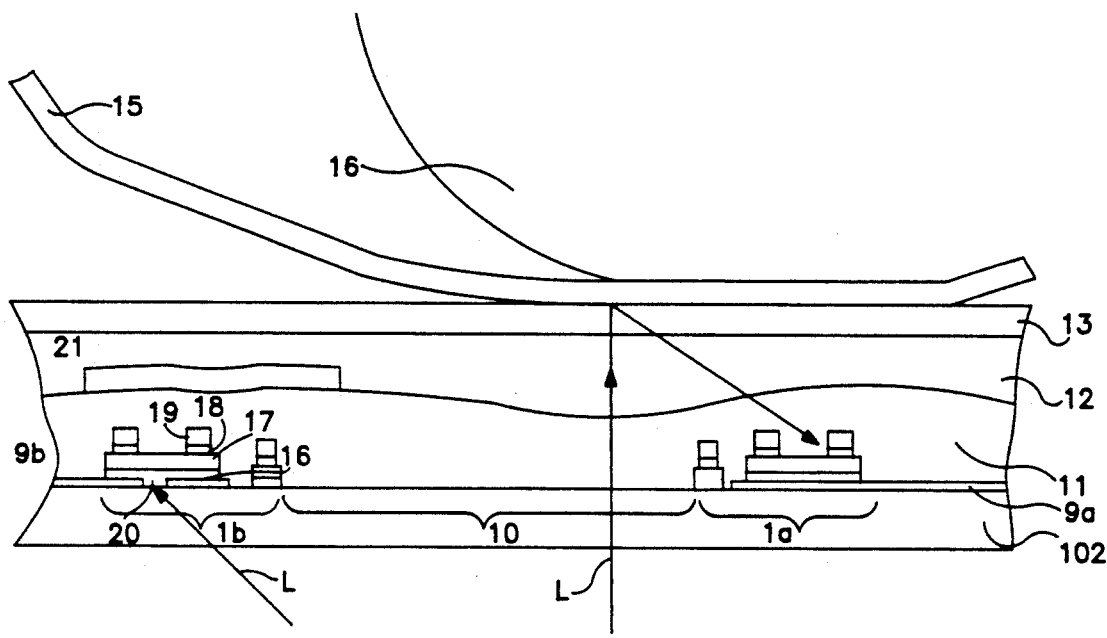
FIG. 17 is a schematic sectional view of the image reading device according to the eighth example of the present invention.

For obtaining the output corresponding to the standard manuscript (blank portion) in the first example as described above, the white standard member 14 was provided corresponding to the sensor portion for sensitivity correction 1b, but as shown in the sixth and seventh examples, the shielding layer 9b having a window may be preferably used. Such constitution a is described by referring to FIG. 17. Of the respective constituents of the eighth example, description is omitted for the same portions as in the first example designated by the same symbols. In this example, the light shielding layer 9b in the sensor portion for sensitivity correction 1b is provided with a window 20 for leading directly the light L to the photoconductive semiconductor constituting the photoelectric converting device 4b. Also, on the upper part of the photoelectric converting device 4b is provided the shielding layer 21 for shielding the reflected light from the original manuscript side. In this case, the size of the window 20 is designed to an adequate size which can obtain an output equivalent to that when employing the white standard member 14 (the first example). Here, since no white standard member 14 is required, the following advantage is also added. That is, when the white standard member 14 is arranged, it is required to be arranged apart to some extent from the roller 16 in order not to obstruct movement of the original manuscript 15, but since equivalency of sensitivity variance should be expected for the signal for correction by providing the sensor portion for sensitivity correction as near the reading sensor portion as possible in accomplishing the object of the present invention, this example becomes further advantageous in this point. Thus, the sensor portion for sensitivity correction can be arranged very near the reading sensor portion, for example, at a position of 1 mm or less, preferably 100 to 200 $\mu$m.

In the above example, the constitution is made such that the light shielding layer 9b is provided with openings with a part of the light shielding layer removed as the light transmitting portion, but the whole light-shielding layer 9b may be also made a constitution having a light transmitting portion by replacing it with a light transmitting layer having a transmittance of 30-40%. With such a constitution, only the dose transmitted through the window 20 can be given to the photoconductive semiconductor 17.

NINTH EXAMPLE

Figure 18:
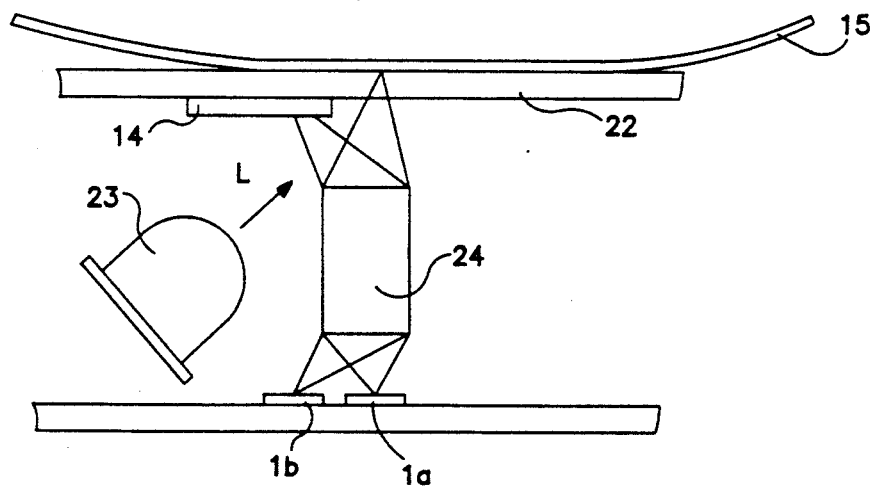
FIG. 18 is a schematic sectional view of the image reading device according to the ninth example of the present invention.

In the first to eighth examples as described above, the image reading device is made to have a constitution of the complete contact type between the reading sensor portion 1a and the original manuscript 15, but it may be also made as a constitution of the equimultiple type using a lens array. Such constitution is described by referring to FIG. 18. This ninth example shows schematically the portions corresponding to FIG. 5 as described above, and the constituents corresponding to the symbols 1a, 1b, 14, 15 and L are made the same as in the first and eighth examples. Here, on the original manuscript stand 22 comprising a transparent glass is irradiated the light L from the light source 23, and the reflected light forms an image through the lens array 24 on the reading sensor portion 1a. On the other hand, the light L from the light source 23 is irradiated also on the white standard member 14 and the reflected light forms an image through the above lens array 24 on the sensor portion for sensitivity correction 1b. Although not shown, in the case of this example, a light shielding means is naturally provided so that no direct light may enter the sensor portions 1a, 1b from the light source 23.

Also in the case of this example, the same effects as in the first and eighth examples can be obtained.

TENTH EXAMPLE

This example has a constitution in which the method is employed to correct the change in sensitivity of the sensor portion for reading by the output from the sensor portion for correction by providing a sensor portion for correction at a place somewhat apart in the sub-scanning direction from the sensor for reading. This method is described by referring to FIGS. 19A, 19B, and 19C and FIG. 20.

FIGS. 19A, 19B, and 19C comprise a schematic sectional view and exploded views for illustration of the constitution of an image reading device using the above method.

Figure 20:
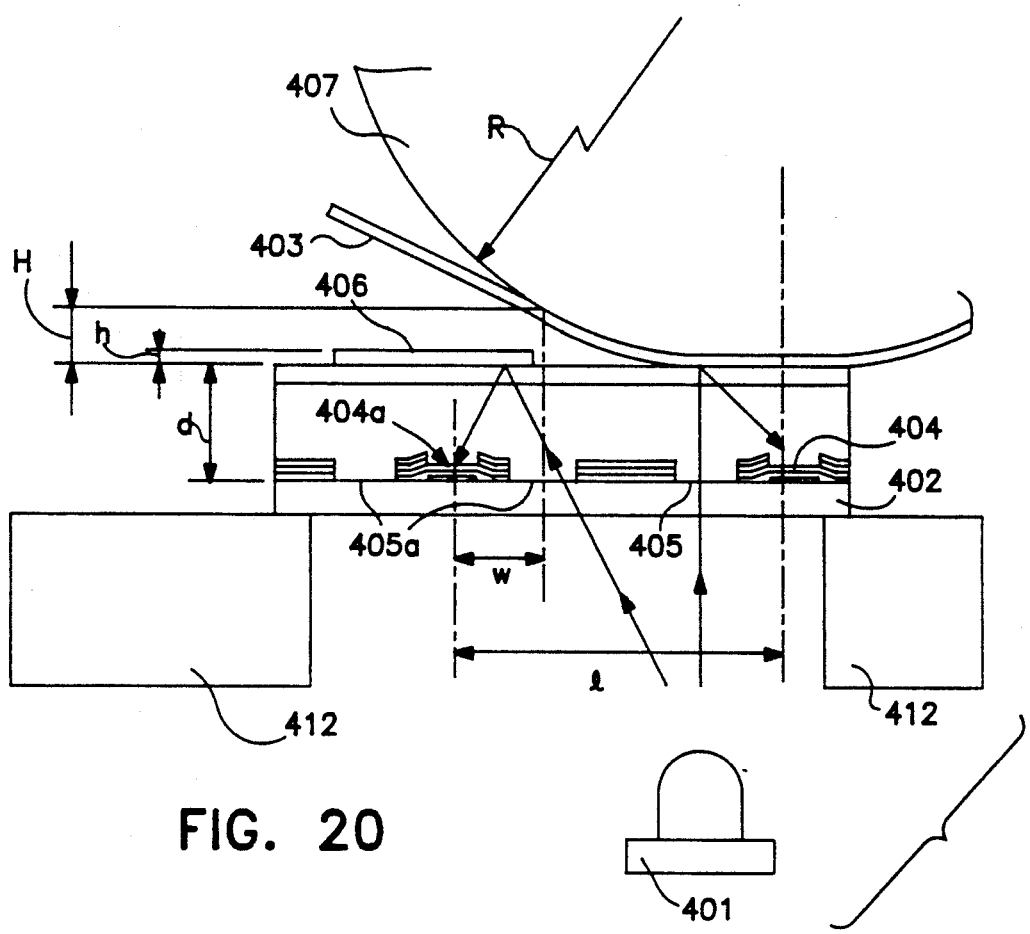
FIG. 20 is a schematic sectional view in the sub-scanning direction of the image reading device of the tenth example of the present invention.

FIG. 20 is a longitudinal sectional view in the sub-scanning direction of the above image reading device.

In FIGS. 19A, 19B, and 19C, and FIG. 20, 401 is the LED array which becomes the light source, 402 the transparent substrate which becomes the substrate, 403 the original manuscript, 404 the sensor for reading, 404a the sensor for correction, 405 the light transmitting portion for permitting the light irradiating the sensor portion for reading to transmit therethrough (hereinafter called window), 405a a transmitting portion for permitting the light irradiating the sensor portion for correction to transmit therethrough (hereinafter called window), 406 the white paint portion provided above the sensor for correction, and 407 the roller for pressing the original manuscript. In FIGS. 19A, 19B, and 19C, for making the explanation easier, the transparent substrate 402, the original manuscript 403, the roller 407 and the LED array 401 conventionally provided in close contact with or adjacent to each other are shown as vertically apart from each other.

The light flux emitted from the LED array 401 passes through the transparent substrate 402, passes through the window 405 near the reading sensor, is diffusion reflected against the surface of the original manuscript 403 and then enters the sensor portion 404 for reading. Also, a part of the light flux passes through the transparent substrate 402, passes through the window 405a of the sensor for correction, is diffusion reflected against the white paint portion 406 and then enters the sensor portion for correction 404a.

The sensor portions for reading 404 are provided in a row in the main scanning direction, and a plurality of sensor portions for correction 404a are provided in a row in the main scanning direction at the place apart at a certain distance from them in the sub-scanning direction. The sensors for correction 404a are provided at a ratio of one bit per 32 bits of the sensors for reading. Since the sensor portions 404 for reading of 32 bits and the sensor portion 404a for correction are proximate in distance to each other, the temperature characteristics of a-Si:H layer, etc. are substantially the same. Therefore, by making the value of the output from the sensor portions for reading 404 divided by the output from the sensor portion for correction 404a corresponding to the bits, the output as the unit will not be substantially changed even if the environmental temperature may change. In this case, for increasing the precision of correction by increasing the S/N of the signal, the output of the sensor portion for correction 404a should be desirably substantially the same as the output when the sensor portions for reading 404 read the white original manuscript. Therefore, the doses received by the reading sensor 404 and the sensor for correction 404a should be desirably approximately the same.

On the other hand, the sensor for reading 404 and the sensor 404a for correction should be both irradiated at high doses for improving S/N ratio. The S/N ratio is improved by increasing even the dose of the sensor portion for correction 404a, because the error of the signal after correction becomes greater if the does of the sensor portion for correction 404a is low to give a poor S/N ratio although the dose of the sensor portion for reading 404 may be high with good S/N ratio.

Thus, it is desirable that the doses received by the sensor portion for reading 404 and the sensor portion for correction 404a should be substantially equal, and also irradiated at high doses.

As the means for irradiating the sensor portion for reading 404 and the sensor portion for correction 404a at high doses, the light may be focused by placing a rod lens on the LED to increase the dose.

Figure 21:
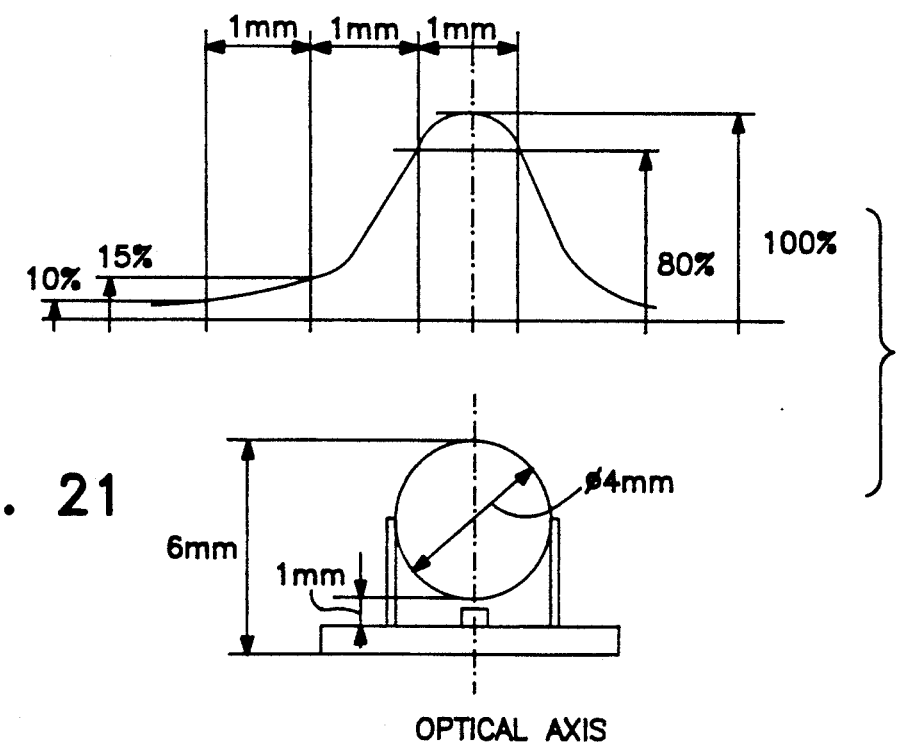
FIG. 21 is an illustration showing the optical characteristics of the LED array of the image reading device.

FIG. 21 is an illustration showing the optical characteristics of the LED array of the above image reading device.

In the same figure, there are shown a sectional view of the LED array, and the luminosity distribution at the light-receiving surface.

In the rod lens used for the LED array, the range where high luminosity is obtained, which depends also on selection of the lens diameter, may be generally about 0.7 to 1 mm, and outside of this range, the luminosity will be abruptly lowered (although there is also the type in which the light focusing degree is alleviated by lowering the radius of curvature of the lens than this range to broaden the light focusing width, the luminosity will not be increased even at the peak as a compensation for broadening the light focusing width. For this reason, the S/N ratio of the chips is lowered when the same LRDS chip is used, and an LED with higher emission efficiency must be used, higher current passed through the LED or more LED employed for obtaining the same S/N ratio, whereby increased cost or lowering in reliability, increased heat generation will be brought about.

By use of such a rod array lens, and so that the doses received by both of the sensor portion for reading and the sensor portion for correction may be substantially equal, the sensor portion for reading and the sensor portion for correction are provided at about 1 mm apart little dose even if there may be a positional error.

ELEVENTH EXAMPLE

The distance thus made within 1 mm between the sensor for reading and the sensor for correction may become sometimes a restriction in degrees of freedom in designing of the sensor pattern. Also, depending on the height of the white paint placed on the correction bit, it may sometimes become an obstacle in paper delivery. Further, higher precision can be required in assembling, because the two bits must be placed within the width of 1 mm in the sub-scanning direction.

Even when there is such a demand, within the range where the variance due to the distance of the corresponding reading sensor portion and the correction sensor portion is neglible relative to the variance in the main scanning direction, the following constitution can be employed to cope with such a.

This example enables further broadening of the permissible range of the arrangement interval between both sensor portion while maintaining the doses incident on the sensor portion for reading and the sensor portion for correction at a constant level or higher, by lowering the luminosity at the sensor portion for correction as compared with that at the sensor portion for reading the light, thereby controlling the light flux so that the dose incident on the sensor portion for reading and the dose incident on the sensor portion for correction may be substantially the same.

In the following, this example of the present invention is described in more detail.

Figure 22:
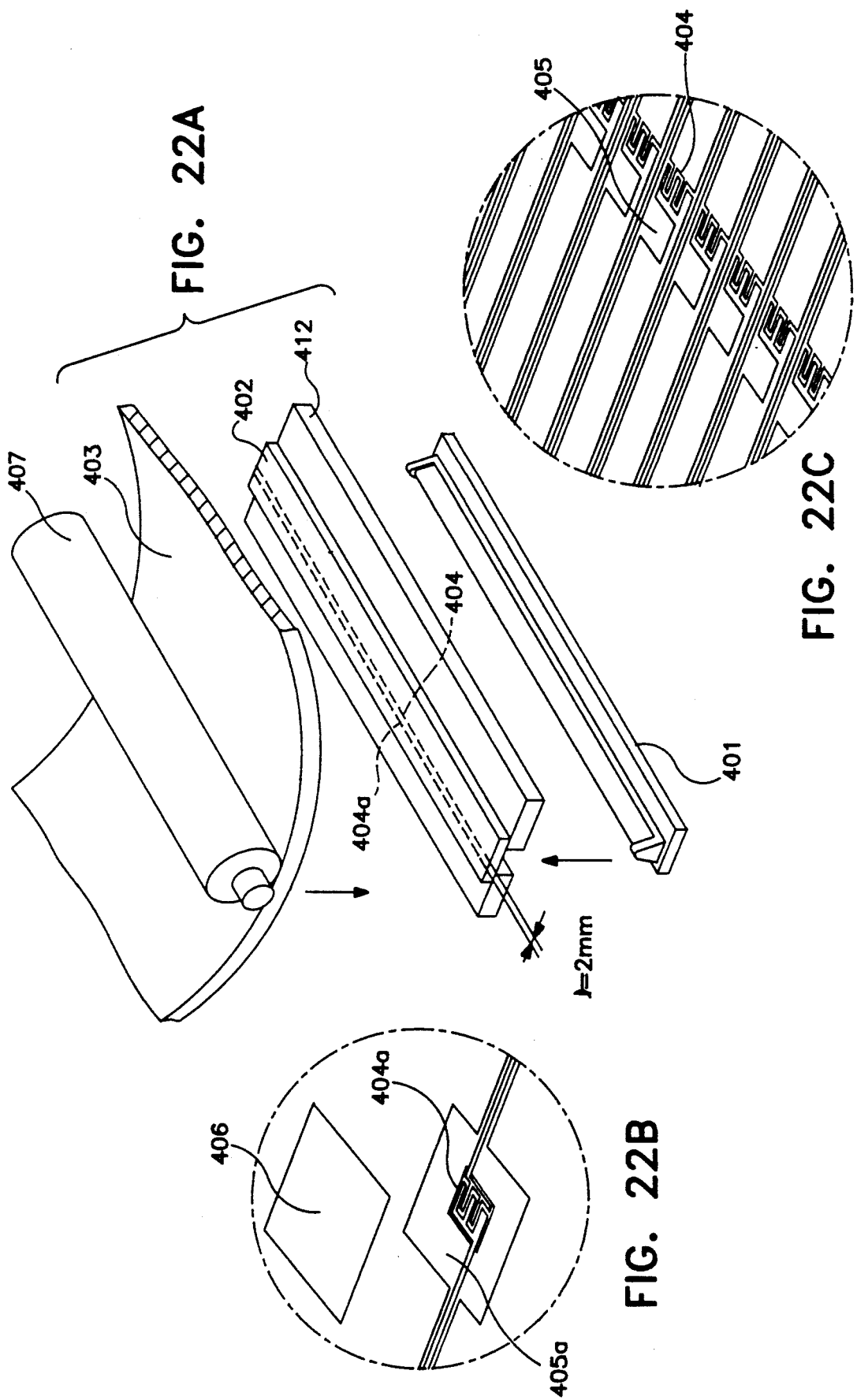
FIGS. 22A, 22B, and 22C comprise is a schematic illustration and exploded views of the image reading device according to the eleventh example of the present invention.

FIGS. 22A, 22B, and 22C comprise a schematic illustration and exploded views for illustration of the constitution of an example of the image reading device of the present invention. The basic constitution of this example is equal to that of the image reading device shown in FIGS. 19A, 19B, and 19C, and FIG. 20, and the longitudinal sectional view is referred to FIG. 20, and the respective constituent members are attached with the same symbols, and description thereof is omitted. In FIGS. 22A, 22B, and 29C, 401–407, 404a and 405a correspond to 401–407 404a and 405a in FIGS. 19A, 19B, and 19C.

In this example, as shown in FIGS. 22A, 22B and 22C the window 405a in the vicinity of the sensor portion for correction is made larger than the window 405 in the vicinity of the sensor portion for reading 404. By doing so, in spite of low luminosity of the sensor for correction 404a illuminated by the light source, the dose of the light flux passing through the window 405a then reflected by the white paint portion 406 and reaching the sensor for correction 404a becomes substantially equal to that when a white original manuscript is placed on the sensor portion for reading. Therefore, the output from the sensor portion for correction and the output when the sensor portion for reading reads the white original manuscript become substantially the same, whereby precision of reading can be ensured.

Further, since the thickness of the white paint at the white paint portion can be made thick as about 100 μm or more, coating can be done more easily.

In this example, the windows 405 and 405a differ in both shape and size, but the dose incident on the above sensor for reading and the dose incident on the above sensor for correction may be made also substantially the same.

The first light transmitting portion through which the illuminating light for illuminating the object to be read by the first photosensor portion is transmitted has a lower light transmittance than the second light transmitting portion through which the illuminating light for illuminating the object to be read by the second photosensor portion is transmitted. The material constituting the first light transmitting portion and the material constituting the second light transmitting portion may be different. The first light transmitting portion may comprise a first opening provided on the first light shielding means. The second light transmitting portion may comprise a second opening provided on the second light shielding means, with the sizes of the first and second openings being different.

In this example, the distance Ω measured between the sensor portion for reading and the sensor portion for correction along the subscanning direction shown in FIGS. 19A, 19B, and 19C can be made 1 mm or more (here Q is taken larger as 2 mm). In this example, the diameter R of the original manuscript pressing roller 407 (shown in FIG. 20) is made 7 mm, and the distance w between the end of the white paint and the sensor for correction (shown in FIG. 20) 0.3 mm. Therefore, the distance H between the protective layer surface and the roller surface at the end of the white paint portion 406 (shown in FIG. 20) becomes as large as 413 μm, and a clearance of 300 μm or more is obtained even when the thickness h of the white paint (shown in FIG. 20) may be made 100 μm. By this, sureness of paper delivery can be ensured.

As described in detail above, according to the image reading device of this example, by making the luminosity of the sensor portion for correction lower as compared with that sensor portion for reading, the permissible range of the arrangement interval between the both sensors can be broadened and therefore variance in the preparation steps is more permissible and also sureness of paper delivery can be enhanced. on the other hand, by controlling the light flux so that the dose incident on the sensor portion for reading and the dose incident on the sensor portion for correction may be substantially equal thereby to obtain both high doses, it becomes possible to ensure precision of correction.

As the method for effecting such correction, there is the method of irradiating light on the white paint and effecting white correction by utilizing the reflected light, and since the interval between the sensor portion for reading and the sensor portion for correction can be made broad as 1 mm or more, the white paint can be made thicker without consideration of paper jamming, etc. thereby making the preparation steps easier.

The image reading device described above is mounted as the contact type image sensor unit on an information processing device.

An example is described below.

Figure 23:
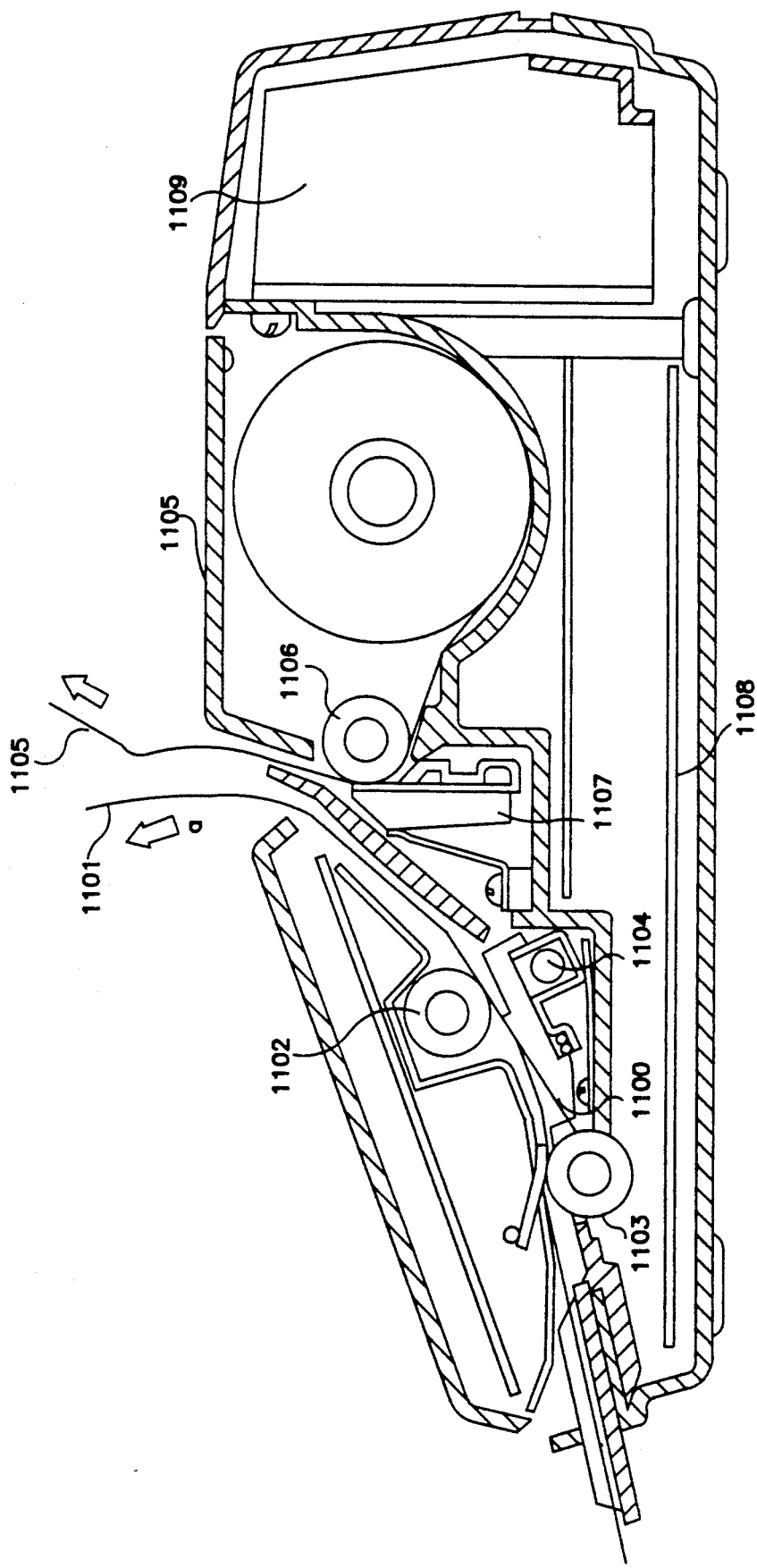
FIG. 23 is a schematic constitutional view showing a facsimile device as the information processing device which uses the image reading device according to the present invention.

FIG. 23 is a schematic constitutional view showing a facscimile device as the information processing device using of the image reading device according to the present invention.

In the same FIG., during delivery of the original manuscript, the original manuscript 101 is pressure contacted on the contact type image sensor unit 100 by means of the platen roller 102, and moves toward the arrowhead a direction by the platen roller 102 and the paper delivery roller 103. The original manuscript surface is illuminated by the xenon lamp 104 which is the light source, and the reflect light enters the sensor unit 100 to be converted to the electrical signal corresponding to the image information of the original manuscript and outputted by the signal processing means.

Also, during signal reception, the recording paper 105 is conveyed by the platen roller 106, and the image corresponding to the receiving signal is reproduced by the thermal head 107 as the recording means. As the recording means, other than this, there is the ink jet recording head which discharges ink by utilizing thermal energy.

The whole device is controlled by the controller of the system control substrate 108, and to the respective driving systems and the respective circuits is supplied power from the power source 109.

By applying the image reading device of this example of such a device as the contact type image sensor, it becomes possible to provide a facscimile device with further reduced cost and miniaturization.

In the respective examples as described above, the so called TFT type sensor as the photoelectric converting device and TFT type construction as the scanning portion is used, but the type of the photoelectric device and the type of the scanning portion is not limited as described above.

According to the examples as described above, since the sensor portion for sensitivity correction is arranged in parallel in the vicinity of the row of the photoelectric converting device of the reading sensor portions and the signal for correction is constantly obtained here, no memory for the signal for correction is necessary and the signal for correction is obtained along with reading, whereby correct electrical signals can be ensured and reproduction of images can be done at high quality without influences from temperature and over time.

What is claimed is:

1. An image reading method, comprising the steps of:
   irradiating with a light source a light onto an object carrying image information to be read; and
   correcting image signals obtained by photoelectric conversion of light reflected from the object using a first photoelectric converting device, said correcting being based on a correction signal which corresponds to a signal obtained by photoelectric conversion of light received by a second photoelectric converting adjacent said first photoelectric converting device;
   wherein said correction signal is obtained by photoselectically converting light emitted from the light source directly to said second photoelectric converting device.

2. An image reading device comprising:
   a first photoelectric converting device, disposed on a light-transmissive substrate, for reading light reflected from an object carrying image information to be read, and for providing image signals; and
   a second photoelectric converting device for providing correction signals corresponding to reference signals obtained by photoelectric conversion of light reflected from a reference surface said first and second photoelectric converting devices being disposed on the same light-transmissive substrate.
   wherein a photoelectric converting layer of said second photoelectric converting device is formed through a lower layer on said substrate, at least a part of the lower layer comprising a light-transmissive portion, and wherein the correction signal is obtained based on a signal photoelectrically converted by said photoelectric converting layer from light permitted to enter through said light-transmissive portion.

3. An image reading device according to claim 2, wherein said lower layer comprises a control electrode.

4. An image reading device comprising:
   a first sensor portion for receiving at least a part of light reflected from an object to be read, and providing image signals; and
   a second sensor portion for obtaining correction signals for correcting the image signals,
   wherein said second portion includes a means for controlling light flux so that a quantity of light incident on said first sensor portion and a quantity of light incident on said second sensor portion are substantially the same.

5. An image reading device according to claim 4, wherein said first sensor portion and said second sensor portion are provided on the same substrate, and further comprising:
   a first light-transmissive portion and a second light-transmissive portion for respectively permitting the light irradiating said first sensor portion and said second sensor portion to be transmitted therethrough, said first and second light-transmissive portions being disposed on said substrate, a shape and/or a size of said first and second light-transmissive portions being different so that the quantity of light incident on said first sensor portion and the quantity of light incident on said second sensor portion are substantially the same.

6. An image reading device according to claim 4, wherein said first sensor portion and said second sensor portion are each arranged in a row, and an interval between said portions is greater than 1 mm.

7. An image reading device according to claim 5, wherein said first sensor portion and said second sensor portion are each arranged in a row, and an interval between said portions is greater than 1 mm.

* * * * *

UNITED STATES PATENT AND TRADEMARK OFFICE
CERTIFICATE OF CORRECTION

PATENT NO. : 5,233,442

DATED : August 3, 1993

INVENTOR(S) : TATSUNDO KAWAI, ET AL.

It is certified that error appears in the above-indentified patent and that said Letters Patent is hereby corrected as shown below:

COLUMN 1

Line 28, "and" should be deleted.
Line 38, "change" should read --changes--.
Line 41, "a" should read --an--.
Line 45, "to" (second occurrence) should be deleted.
Line 46, "signal particularly" should read --signals. Particularly,
Line 53, "are" should read --is--.
Line 56, "corresponds" should read --correspond--.
Line 60, "fluctuated" should be deleted.
Line 59, "fluctuate" should be deleted.

COLUMN 2

Line 13, "an" should read --the--.
Line 21, "as" should read --such as--.
Line 35, "a" should read --an--.
Line 39, "of" should be deleted.
Line 40, "memory, the" should read --memory 133 through the--.
Line 41, "switch is changed over. The" should read --switch 134. Then,--.
Line 48, 'correspond" should read --and correspond--.

UNITED STATES PATENT AND TRADEMARK OFFICE
CERTIFICATE OF CORRECTION

PATENT NO. : 5,233,442
DATED : August 3, 1993
INVENTOR(S) : TATSUNDO KAWAI, ET AL.

It is certified that error appears in the above-indentified patent and that said Letters Patent is hereby corrected as shown below:

COLUMN 2

Line 50, "system" should read --a system,--.
Line 51, "a," should be deleted.
Line 54, "changes" should be deleted.
Line 55, "over temperature, time," should read --temperature, changes over time,--

COLUMN 3

Line 2, "machine and etc." should read --machines, etc.--.

COLUMN 4

Line 59, after "by a" insert --sensor--.

COLUMN 5

Line 60, "is" should be deleted.

COLUMN 6

Line 25, "an" should be deleted.
Line 68, "information" should read --information,--.

UNITED STATES PATENT AND TRADEMARK OFFICE
CERTIFICATE OF CORRECTION

PATENT NO. : 5,233,442
DATED : August 3, 1993
INVENTOR(S) : TATSUNDO KAWAI, ET AL.

It is certified that error appears in the above-indentified patent and that said Letters Patent is hereby corrected as shown below:

COLUMN 7

Line 45, "changes." should read --changes--.

COLUMN 9

Line 27, "which" should read --(which--.
Line 27, "perpendicular said" should read --perpendicular to said--.
Line 28, "direction" should read --direction)--.
Line 44, "mon" should read --mon,--.

COLUMN 10

Line 29, "and" should be deleted.
Line 30, "example, the" should read --example, and the--.

COLUMN 13

Line 2, "constitution a" should read --a constitution--.

UNITED STATES PATENT AND TRADEMARK OFFICE
CERTIFICATE OF CORRECTION

PATENT NO. : 5,233,442               Page 4 of 5
DATED : August 3, 1993
INVENTOR(S) : TATSUNDO KAWAI, ET AL.

It is certified that error appears in the above-indentified patent and that said Letters Patent is hereby corrected as shown below:

COLUMN 15

Line 6, "does" should read --dose--.
    Line 28, "lowered" should read --lower--.
    Line 30, "lens" should read --lens)--.
    Line 46, "little" should read --with little--.
    Line 63, "a." should read --a variance.--
    Line 66, "portion" should read --portions--.

COLUMN 16

Line 18, "29C," should read --22C,--.
    Line 61, "shown" should read --(shown--.
    Line 62, "19C" should read --19C)--.

COLUMN 17

Line 12, "broadened" should read --broadened,--.
    Line 14, "on" should read --On--.
    Line 25, "broad" should read --as broad--.

UNITED STATES PATENT AND TRADEMARK OFFICE
CERTIFICATE OF CORRECTION

PATENT NO. : 5,233,442
DATED : August 3, 1993
INVENTOR(S) : TATSUNDO KAWAI, ET AL.

It is certified that error appears in the above-indentified patent and that said Letters Patent is hereby corrected as shown below:

<u>COLUMN 18</u>

Line 10, "and over" should read --and changes over--.
    Line 21, "converting" should read --converting device--.
    Line 23, "photose-" should read --photoelectrically--.
    Line 24, "lectically" should be deleted.
    Line 55, "second portion" should read --second sensor portion--.

Signed and Sealed this

Third Day of May, 1994

Attest:

BRUCE LEHMAN

Attesting Officer     Commissioner of Patents and Trademarks